(12) United States Patent
Toriumi

(10) Patent No.: US 9,473,153 B2
(45) Date of Patent: Oct. 18, 2016

(54) OSCILLATION CIRCUIT, OSCILLATOR, ELECTRONIC DEVICE, AND MOVING OBJECT

(71) Applicant: Seiko Epson Corporation, Tokyo (JP)

(72) Inventor: Yuichi Toriumi, Fujimi (JP)

(73) Assignee: Seiko Epson Corporation (JP)

( * ) Notice: Subject to any disclaimer, the term of this patent is extended or adjusted under 35 U.S.C. 154(b) by 18 days.

(21) Appl. No.: 14/514,696

(22) Filed: Oct. 15, 2014

(65) Prior Publication Data

US 2015/0102843 A1    Apr. 16, 2015

(30) Foreign Application Priority Data

Oct. 16, 2013    (JP) .................. 2013-215622

(51) Int. Cl.
*H03L 7/06* (2006.01)
*H03L 7/08* (2006.01)

(52) U.S. Cl.
CPC .................. *H03L 7/0805* (2013.01)

(58) Field of Classification Search
USPC .................. 327/147–149, 156–158
See application file for complete search history.

(56) References Cited

U.S. PATENT DOCUMENTS

| | | | |
|---|---|---|---|
| 6,154,095 A | 11/2000 | Shigemori et al. | |
| 6,337,600 B1 | 1/2002 | Shigemori et al. | |
| 7,821,348 B2 | 10/2010 | Ishimaru et al. | |
| 2003/0058053 A1* | 3/2003 | Jeon | H03C 3/0958 331/17 |
| 2007/0149144 A1* | 6/2007 | Beyer | H03L 7/081 455/76 |
| 2008/0192876 A1* | 8/2008 | Dulger | H03L 7/1806 375/376 |
| 2009/0253382 A1* | 10/2009 | Haralabidis | H04B 1/005 455/73 |
| 2010/0233977 A1* | 9/2010 | Minnis | H03F 1/0211 455/127.1 |
| 2013/0229954 A1* | 9/2013 | Narathong | H04B 1/408 370/280 |
| 2013/0271186 A1* | 10/2013 | Hossain | H03L 7/235 327/107 |
| 2014/0241335 A1* | 8/2014 | Chen | H03L 7/093 370/342 |
| 2015/0102843 A1* | 4/2015 | Toriumi | H03L 7/0805 327/156 |

FOREIGN PATENT DOCUMENTS

| | | |
|---|---|---|
| JP | 07-011024 U | 2/1995 |
| JP | 08-008740 A | 1/1996 |
| JP | 2001-177405 A | 6/2001 |
| JP | 2001-177406 A | 6/2001 |
| JP | 2001-186020 A | 7/2001 |
| JP | 2001-257530 A | 9/2001 |

(Continued)

OTHER PUBLICATIONS

Author: Silicon Laboratories, "Any-Frequency I²C Programmable XO (100 kHz to 250 MHz)", Silicon Laboratories Inc., Austin, TX, 2012, pp. 1-36.

*Primary Examiner* — Adam Houston
(74) *Attorney, Agent, or Firm* — Harness, Dickey & Pierce, P.L.C.

(57) ABSTRACT

An oscillation circuit, an oscillator, an electronic device and a moving object, having at least a serial interface and an output enabling function, which are capable of implementing the control of output enabling without performing exclusive switching control using a switch, are provided. The oscillation circuit generates an oscillation signal by oscillating an oscillation element, and includes a first terminal to which characteristic control data for controlling characteristics of the oscillation signal including at least a frequency is input and to which control data of a first output control signal for controlling an output of the oscillation signal is input.

9 Claims, 10 Drawing Sheets

(56) References Cited

FOREIGN PATENT DOCUMENTS

| JP | 2004-048518 A | 2/2004 |
| JP | 2009-201097 A | 9/2009 |
| JP | 2011-234094 A | 11/2011 |
| JP | 2013-009128 A | 1/2013 |

* cited by examiner

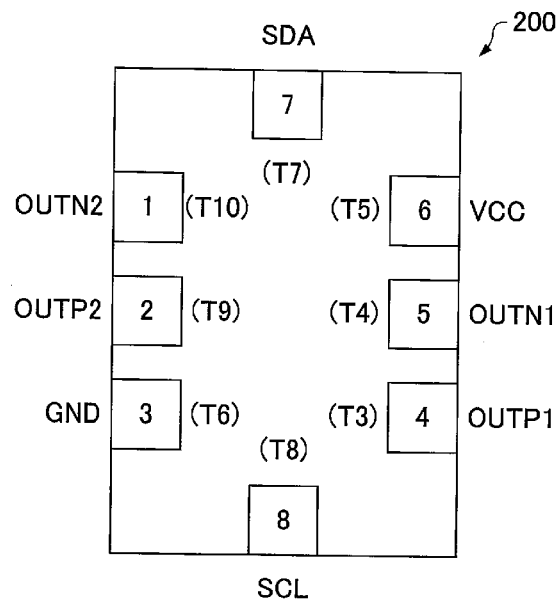
FIG. 6
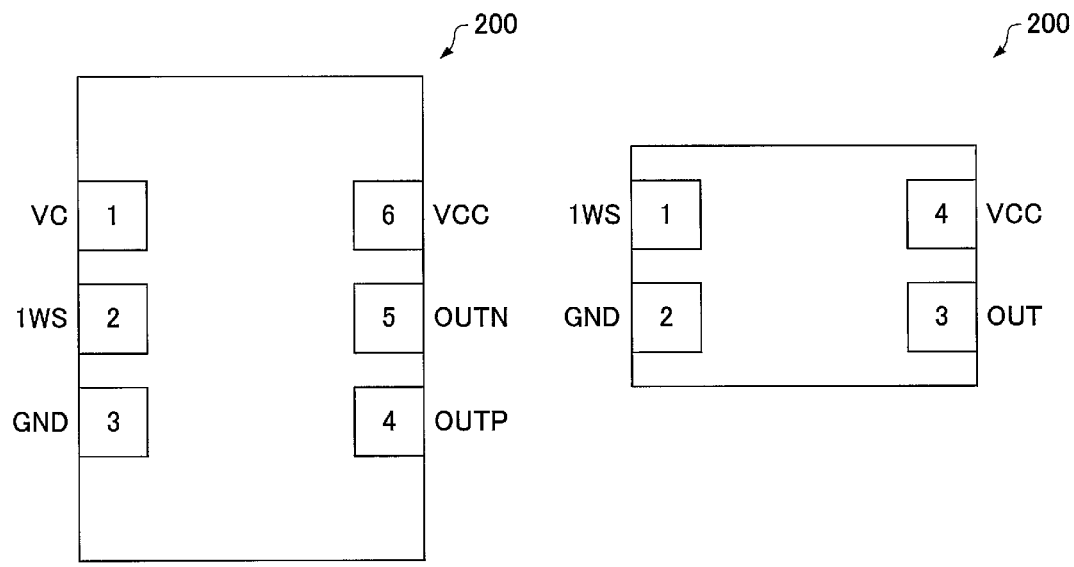
FIG. 7A
FIG. 7B

OSCILLATION CIRCUIT, OSCILLATOR, ELECTRONIC DEVICE, AND MOVING OBJECT

BACKGROUND

1. Technical Field

The present invention relates to an oscillation circuit, an oscillator, an electronic device, and a moving object.

2. Related Art

In recent years, oscillators including a serial interface have been used. In such oscillators, a method can be used for changing an output frequency, for example, by changing the setting of a multiplication number of a phase locked loop (PLL) by operating a register within the oscillator using a signal input from a serial interface.

In such an oscillator, a terminal for a serial interface is required, but an oscillator is generally required to be small in size. For example, in the invention disclosed in JP-A-2009-201097, miniaturization is realized by making a functional terminal of an oscillator double as an inspection terminal of a quartz crystal resonator by using a switch. Here, in an embodiment of the invention disclosed in JP-A-2009-201097, the functional terminal is a standby terminal, which is a terminal having the same function as that of an output enabling terminal and having an opposite logic thereto.

However, in the invention disclosed in JP-A-2009-201097, the switch is required to be controlled when switching the dual-purpose terminal. In other words, since it is necessary to apply a signal for controlling the switch from the outside of the oscillator, a circuit or wiring for controlling the switch has to be provided, which results in problems such as redundancy in the switching process or an increase in the number of wirings for controlling the oscillator.

SUMMARY

An advantage of some aspects of the invention is to provide an oscillation circuit, an oscillator, an electronic device, and a moving object, having at least a serial interface and an output enabling function, which are capable of implementing the control of output enabling (control on whether or not to output an oscillation signal) without performing exclusive switching control using a switch.

The invention can be implemented as the following forms or application examples.

Application Example 1

This application example is directed to an oscillation circuit that generates an oscillation signal by oscillating an oscillation element, the oscillation circuit including a first terminal to which characteristic control data for controlling characteristics of the oscillation signal including at least a frequency is input and to which control data of a first output control signal for controlling an output of the oscillation signal is input.

Here, the characteristic control data is data which is used to control the characteristics of the oscillation signal. The characteristics of the oscillation signal include, for example, an amplitude, a waveform, and the like, in addition to a frequency. When the oscillation circuit according to this application example includes, for example, a PLL, the oscillation circuit may control the characteristics of the oscillation signal by changing a frequency-division ratio of a frequency divider of a feedback loop, a conversion gain of a voltage-controlled oscillator (VCO), and the like using the characteristic control data.

In the oscillation circuit according to this application example, the characteristic control data is input to the first terminal using serial data, and thus it is possible to reduce the number of terminals, as compared to a case where parallel data is input. In the oscillation circuit according to this application example, the control data of the first output control signal is also input to the first terminal, similar to the characteristic control data. At this time, it is possible to implement the control of output enabling (control of whether or not to output the oscillation signal) on the basis of the control data of the first output control signal without performing exclusive switching control using a switch. Therefore, a circuit or wiring for controlling the switch is not required, and thus problems do not occur such as redundancy in a switching process or an increase in the number of wirings for controlling the oscillator.

In the oscillation circuit according to this application example, it is possible to receive the characteristic control data and the control data of the first output control signal using the same serial data and to consolidate the data into a process of the same communication unit. For this reason, in the oscillation circuit according to this application example, it is possible to easily associate the change in the characteristics of the oscillation signal using characteristic control data with a before-and-after relationship between the timings of the outputs of the oscillation signal based on the first output control signal.

Application Example 2

The oscillation circuit according to the application example described above may further include a second terminal to which a second output control signal for controlling an output of the oscillation signal is input.

The oscillation circuit according to this application example includes the second terminal, and thus it is possible to receive a second output control signal for controlling the output of the oscillation signal from the second terminal. At this time, the second output control signal from the second terminal can implement the control of output enabling similar to the first output control signal. A time between when the start of control is instructed from the outside of the oscillation circuit and when the oscillation signal is output (or the output is stopped) in a case where the control of output enabling is implemented using the first output control signal may be different from that in a case where the control of output enabling is implemented using the second output control signal.

Thus, according to the oscillation circuit of this application example, it is also possible to select a time until the oscillation signal is output (or the output is stopped) by using the first output control signal and the second output control signal for different purposes. For example, in a case where the first output control signal is used when the characteristic control data is updated, it is not possible to output the oscillation signal (or to stop the output of the oscillation signal) at least until the update of the characteristic control data is completed. However, in a case where the second output control signal is used, it is possible to immediately output the oscillation signal (or to stop the output of the oscillation signal) regardless of whether or not the characteristic control data is updated.

Application Example 3

In the oscillation circuit according to the application example described above, the oscillation circuit may further include a storage unit that stores the characteristic control data and the control data of the first output control signal.

Application Example 4

In the oscillation circuit according to the application example described above, the characteristics of the oscillation signal and the output of the oscillation signal may be controlled on the basis of the characteristic control data and the control data of the first output control signal which are stored in the storage unit.

The oscillation circuit of this application example includes a storage unit (for example, a register) which stores the characteristic control data and the control data of the first output control signal. In addition, the outputs of the oscillation signal and the characteristics of the oscillation signal are controlled on the basis of the value of the storage unit. The characteristic control data and the control data of the first output control signal are consolidated as the value of the storage unit, and thus it is possible to ascertain the characteristics and an output state of the oscillation signal, for example, with reference to the storage unit from the outside of the oscillation circuit. For this reason, it is possible to simplify a program for controlling, for example, the oscillation circuit according to this application example.

Application Example 5

The oscillation circuit according to the application example described above may further include an oscillation unit that generates the oscillation signal and an output buffer to which the oscillation signal is input from the oscillation unit. The control data of the first output control signal for instructing the output of the oscillation signal to stop may be input to the first terminal, so that an output from the output buffer is stopped and an output of the oscillation signal is stopped.

According to the oscillation circuit of this application example, the output buffer is controlled in accordance with the instruction contents of the control data of the first output control signal. Specifically, the control data of the first output control signal for instructing the output of the oscillation signal to stop is input to the first terminal, so that a signal output from the output buffer is stopped and the output of the oscillation signal is stopped. At this time, the oscillation unit generating the oscillation signal continuously operates, and thus it is possible to quickly restart the output of the oscillation signal when the oscillation signal is instructed to be output again.

Application Example 6

The oscillation circuit according to the application example described above may further include an oscillation unit that generates the oscillation signal and an output buffer to which the oscillation signal is input from the oscillation unit. The control data of the first output control signal for instructing the output of the oscillation signal to stop may be input to the first terminal, so that an operation of the oscillation unit is stopped and an output of the oscillation signal is stopped.

According to the oscillation circuit of this application example, the operation of the oscillation unit is controlled in accordance with the instruction contents of the control data of the first output control signal. Specifically, the control data of the first output control signal for instructing the output of the oscillation signal to stop is input to the first terminal, so that the operation of the oscillation unit is stopped, for example, by not supplying power to the oscillation unit and so that the output of the oscillation signal is stopped. The operation of the oscillation unit is stopped when the oscillation signal is not output, and thus it is possible to reduce power consumption.

Application Example 7

The oscillation circuit according to the application example described above may further include a plurality of output terminals that output the oscillation signals. The control data of the first output control signal may be data having values of a plurality of bits, and the outputs of the oscillation signals from the plurality of output terminals may be independently controlled using the respective values of the plurality of bits.

According to the oscillation circuit of this application example, the control data of the first output control signal is serial data, and thus it is possible to receive the control data using only the first terminal regardless of the data size. Accordingly, when the oscillation circuit includes a plurality of output terminals that output an oscillation signal, it is possible to independently control whether or not to output the oscillation signal from the plurality of output terminals and whether or not to stop the output, using the control data of the first output control signal without increasing the number of input terminals (for example, the above-mentioned second terminal). Meanwhile, the output of the oscillation signal includes not only the output of the intact oscillation signal but also the output of the oscillation signal by performing a predetermined conversion thereon (for example, by converting the output into a differential output). The term "values of a plurality of bits" used herein refers to the values of two bits or more, and the term "respective values of the plurality of bits" used herein refers to values of the respective bits.

Application Example 8

This application example is directed to an oscillator including the oscillation circuit according to the application example described above and the oscillation element.

Application Example 9

This application example is directed to an electronic device including the oscillation circuit according to the application example described above or the oscillator according to the application example described above.

Application Example 10

This application example is directed to a moving object including the oscillation circuit according to the application example described above or the oscillator according to the application example described above.

The oscillator, the electronic device, and the moving object according to the application examples include the oscillation circuit in which the characteristic control data and the control data of the first output control signal are input to the first terminal of the oscillation circuit. For this reason, it is possible to implement the control of output enabling on the basis of the control data of the first output control signal without performing exclusive switching control using a switch. In addition, it is possible to easily associate the change in the characteristics of the oscillation signal using characteristic control data with a before-and-after relationship between the timings of the outputs of the oscillation signal based on the control data of the first output control signal, and to simplify a control program.

BRIEF DESCRIPTION OF THE DRAWINGS

The invention will be described with reference to the accompanying drawings, wherein like numbers reference like elements.

FIG. 6 is a diagram showing an exterior of the oscillator including the oscillation circuit according to the third embodiment.

FIGS. 7A and 7B are diagrams showing an exterior of an oscillator in a case where one-wire serial communication can be performed.

DESCRIPTION OF EXEMPLARY EMBODIMENTS

Hereinafter, preferred embodiments of the invention will be described in detail with reference to the accompanying drawings. Meanwhile, the embodiments described below do not unduly limit the aspects of the invention described in the appended claims. In addition, all the configurations described below are not necessarily essential components of the invention.

Figure 1:
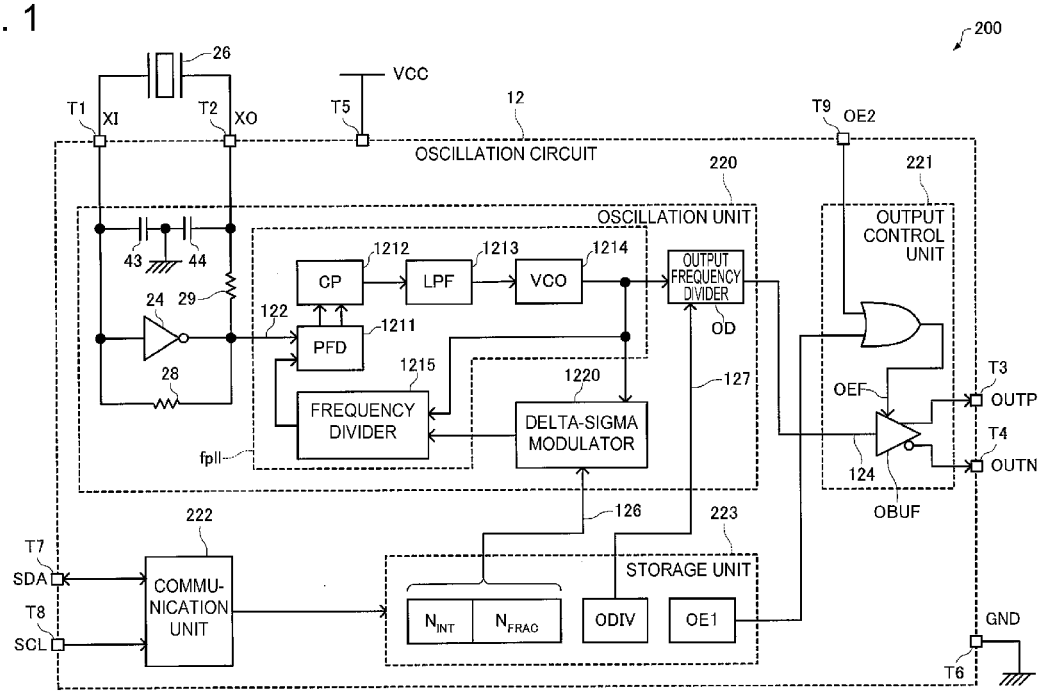
FIG. 1 is a block diagram of an oscillator including an oscillation circuit according to a first embodiment.

1. Oscillation Circuit and Oscillator
1.1. First Embodiment
1.1.1. With Regard to Overall Configuration FIG. 1 is a block diagram of an oscillator 200 including an oscillation circuit 12 according to a first embodiment. The oscillation circuit 12 includes an oscillation unit 220 that generates an oscillation signal 124 by oscillating an oscillation element, an output control unit 221 that receives an input of the oscillation signal 124 from the oscillation unit 220, converts the signal into a predetermined output format, and outputs the converted signal, a communication unit 222 that receives an input of serial data from the outside, and a storage unit 223 that includes a register capable of updating data content from the outside using the input serial data. Meanwhile, the storage unit 223 may be constituted by any of various well-known rewritable non-volatile memories such as, for example, an electrically erasable programmable read-only memory (EEPROM) or a flash memory, as long as data content can be updated from the outside, or may be configured to include a non-volatile memory and a register.

In this embodiment, an AT cut quartz crystal resonator 26 is used as the oscillation element, but the invention is not limited thereto. For example, an SC cut quartz crystal resonator, a tuning fork type quartz crystal resonator, a surface acoustic wave (SAW) resonator, other piezoelectric resonators, a micro electro mechanical systems (MEMS) resonator, or the like can be used.

The oscillation circuit 12 constitutes a portion of the oscillator 200. Examples of the oscillator include a piezoelectric oscillator (quartz crystal oscillator or the like) such as a temperature compensated crystal oscillator (TCXO: temperature compensation type oscillator), a voltage-controlled crystal oscillator (VCXO: voltage-controlled oscillator), or an oven-controlled crystal oscillator (OCXO: constant temperature oscillator), a SAW oscillator, a silicon oscillator, an atomic oscillator, and the like. In this embodiment, a description will be given on the assumption that the oscillation circuit 12 constitutes a portion of a simple packaged crystal oscillator (SPXO) which is a quartz crystal oscillator that does not particularly perform temperature compensation and the like. At this time, a difference in components between the oscillator 200 and the oscillation circuit 12 is in only the quartz crystal resonator 26, and thus a description of the oscillation circuit 12 may be given below with a description of the oscillator 200 without notice.

As shown in FIG. 1, the oscillation circuit 12 may be formed as an integrated circuit (IC) and may include terminals T1 and T2 for connecting with the quartz crystal resonator 26. Here, it is assumed that an input signal on the terminal T1 side is XI and an output signal on the terminal T2 side is XO. The oscillation circuit 12 may include terminals T3 and T4 for differentially outputting the oscillation signal 124. Here, it is assumed that a non-inverted output signal on the terminal T3 side is OUTP and an inverted output signal on the terminal T4 side is OUTN. The oscillation circuit 12 may include terminals T5 and T6 for supplying a power supply voltage VCC and a ground voltage GND, respectively. The oscillation circuit 12 may include terminals T7 and T8 which are two-wire serial interfaces. In this embodiment, an inter-integrated circuit (I2C) is used as a system of a serial interface, and it is assumed that serial data on the terminal T7 side is SDA and a serial clock on the terminal T8 side is SCL. In addition, the oscillation circuit 12 may include a terminal T9 for receiving a second output control signal OE2 for controlling whether or not to differentially output the oscillation signal 124.

Meanwhile, the oscillation circuit 12 may constitute the oscillator 200 which is integrally packaged inclusive of the quartz crystal resonator 26. At this time, terminals T3 to T9 other than the terminals T1 and T2 connected to the quartz crystal resonator 26 may be used as terminals of the oscillator 200 as they are. In addition, instead of a two-wire serial interface, a three-wire serial interface such as, for example, a serial peripheral interface (SPI) may be used, or a one-wire serial interface such as, for example, 1-WIRE (registered trademark) may be used. In this embodiment, the oscillation signal 124 is differentially output, but a single-ended output may be used.

1.1.2. With Regard to Oscillation Unit

The oscillation unit 220 includes a main circuit unit that generates a reference oscillation signal 122 (signal serving as a reference of the oscillation signal 124) by oscillating the quartz crystal resonator 26, a fractional N-PLL (fpll of FIG. 1), a delta-sigma modulator 1220, and an output frequency divider OD that frequency-divides a signal received from the fractional N-PLL and outputs the signal as the oscillation signal 124.

The main circuit unit is constituted by an inverter 24, including a feedback resistor 28 functioning as an analog inverting amplifier, oscillation stabilizing capacitors 43 and 44, and an amplitude limiting resistor 29 being connected to each other as shown in FIG. 1. An input side and an output side of the inverter 24 are connected to the quartz crystal resonator 26 through the terminals T1 and T2, respectively, and generate the reference oscillation signal 122 by oscillating the quartz crystal resonator 26.

The fractional N-PLL (fpll of FIG. 1) is a PLL that implements a frequency-division ratio, which is on average a decimal between $N_{INT}$ and $N_{INT}+1$ which are integers, by switching a frequency-division ratio of a frequency divider 1215 that frequency-divides an output of a VCO 1214. The fractional N-PLL includes a phase frequency detector (PFD) 1211, a charge pump (CP) 1212, a low-pass filter (LPF) 1213, a VCO 1214, and a frequency divider 1215. In addition, the delta-sigma modulator 1220 generates a signal for instructing the switching of the frequency-division ratio of the frequency divider 1215.

The PFD 1211 receives the reference oscillation signal 122 as a reference signal, detects a phase difference from a feedback signal received from the frequency divider 1215, and outputs an UP signal and a DOWN signal in accordance with the phase difference. The CP 1212 outputs a current having a value based on the UP signal and the DOWN signal. The LPF 1213 controls the VCO 1214 by removing a high frequency noise component from the current and converting the current into a voltage. The VCO 1214 changes an output frequency in accordance with a control voltage output from the LPF 1213. The frequency divider 1215 frequency-divides an output signal of the VCO 1214 and outputs the signal to the PFD 1211 as a feedback signal.

The delta-sigma modulator 1220 temporally switches the frequency-division ratio in the frequency divider 1215 using $N_{INT}$ and $N_{INT}+1$ by the setting of the frequency-division ratio. When it is assumed that a frequency of a reference signal (reference oscillation signal 122) is $F_{REF}$, an integer portion of the frequency-division ratio is $N_{INT}$, and a fraction portion (portion after the decimal point) thereof is $N_{FRAC}/2^m$, a frequency $F_{VCO}$ of the output signal of the VCO 1214 is expressed by the following Expression (1).

$$F_{VCO} = F_{REF} \times \left(N_{INT} + \frac{N_{FRAC}}{2^m}\right) \quad (1)$$

Meanwhile, "m" denotes the number of bits of $N_{FRAC}$, and $N_{FRAC}/2^m$ denotes a value which is less than 1. For example, $N_{FRAC}$ may be a value of 24 bits (m=24). In addition, $N_{INT}$ may be a value of, for example, 6 bits.

In addition, since the frequency-division ratio can be aperiodically switched by using the delta-sigma modulator 1220, there is an advantage in that fractional spuriousness which is inherent spuriousness depending on a switching period is not likely to occur. Meanwhile, an accumulator type fractional N-PLL using an accumulator may be used instead of the delta-sigma modulator 1220.

The output frequency divider OD frequency-divides a signal received from the fractional N-PLL and outputs the signal as the oscillation signal 124. When the frequency-division ratio of the output frequency divider OD is assumed to be ODIV, a frequency $F_O$ of the oscillation signal 124 is expressed by the following Expression (2).

$$F_O = \frac{F_{VCO}}{ODIV} = \frac{F_{REF} \times \left(N_{INT} + \frac{N_{FRAC}}{2^m}\right)}{ODIV} \quad (2)$$

1.1.3. With Regard to Communication Unit and Storage Unit

As described above, the frequency $F_O$ of the oscillation signal 124 can be changed by $N_{INT}$, $N_{FRAC}$, and ODIV which are parameters of Expression (2). This makes it possible to generate the oscillation signal 124 having various frequencies in the oscillation circuit 12, thereby providing a user-friendly oscillation circuit 12. Here, in order to update these parameters without significantly increasing the number of terminals, an I2C which is two-wire serial communication is used as the system of the serial interface in the oscillation circuit 12 according to this embodiment.

The communication unit 222 converts received serial data into parallel data and converts data to be output from the oscillation circuit 12 into serial data. As shown in FIG. 1, when the communication unit 222 receives the parameters of Expression (2), the communication unit outputs the parameters to the storage unit 223 and updates the parameters. The storage unit 223 includes registers that store $N_{INT}$, $N_{FRAC}$, and ODIV, respectively, and the updating of the values of the registers refers to the updating of the parameters.

For example, the delta-sigma modulator 1220 ascertains the setting of a frequency-division ratio by receiving the value of the register storing $N_{INT}$ and $N_{FRAC}$ as an internal signal 126, and temporally switches the frequency-division ratio in the frequency divider 1215 using $N_{INT}$ and $N_{INT}+1$. In addition, for example, the output frequency divider OD receives the value of the register storing ODIV as an internal signal 127 and frequency-divides the signal received from the fractional N-PLL, thereby generating the oscillation signal 124.

Meanwhile, examples of characteristics of the oscillation signal 124 include an amplitude, a waveform, and the like in addition to a frequency $F_O$, and parameters capable of changing the characteristics may be stored in registers of the storage unit 223. For example, the storage unit 223 may include a register that stores a parameter for determining a conversion gain of the voltage-controlled oscillator (VCO). Here, in serial data SDA, a parameter used to control the characteristics of the oscillation signal 124 is referred to as characteristic control data in distinction from control data of a first output control signal OE1 to be described later.

1.1.4. With Regard to Output Control Unit

The output control unit 221 converts the oscillation signal 124 into a differential signal by an output buffer OBUF and outputs the converted signal. The oscillation circuit 12 according to this embodiment outputs a non-inverted output signal OUTP from the terminal T3 and outputs an inverted output signal OUTN from the terminal T4. Output of the non-inverted output signal OUTP and the inverted output signal OUTN is controlled using an output enabling signal OEF. In the oscillation circuit 12 according to this embodiment, the non-inverted output signal OUTP and the inverted output signal OUTN are output when the output enabling signal OEF is in a high level ("1"), and the non-inverted output signal OUTP and the inverted output signal OUTN are not output when the output enabling signal OEF is in a low level ("0"). For example, in an unstable state due to an insufficient increase in the amplitude of the oscillation signal 124, the output enabling signal OFF is set to "0" so as to control the non-inverted output signal OUTP and the inverted output signal OUTN not to be output, that is, so as to stop the output of the non-inverted output signal OUTP and the inverted output signal OUTN.

The output control unit 221 sets an output of an OR circuit, which receives the first output control signal OE1 and the second output control signal OE2, to be the output enabling signal OEF. As shown in FIG. 1, the second output control signal OE2 is a signal which is input from the terminal T9 (corresponding to a second terminal according to the invention). On the other hand, the control data of the first output control signal OE1 is a signal which is input from the terminal T7 (corresponding to a first terminal according to the invention) as the serial data SDA, similar to the characteristic control data, and which is stored in the register of the storage unit 223. When at least one of the first output control signal OE1 and the second output control signal OE2 is "1", the output enabling signal OEF is set to "1", and thus the non-inverted output signal OUTP and the inverted output signal OUTN are output.

Figure 8:
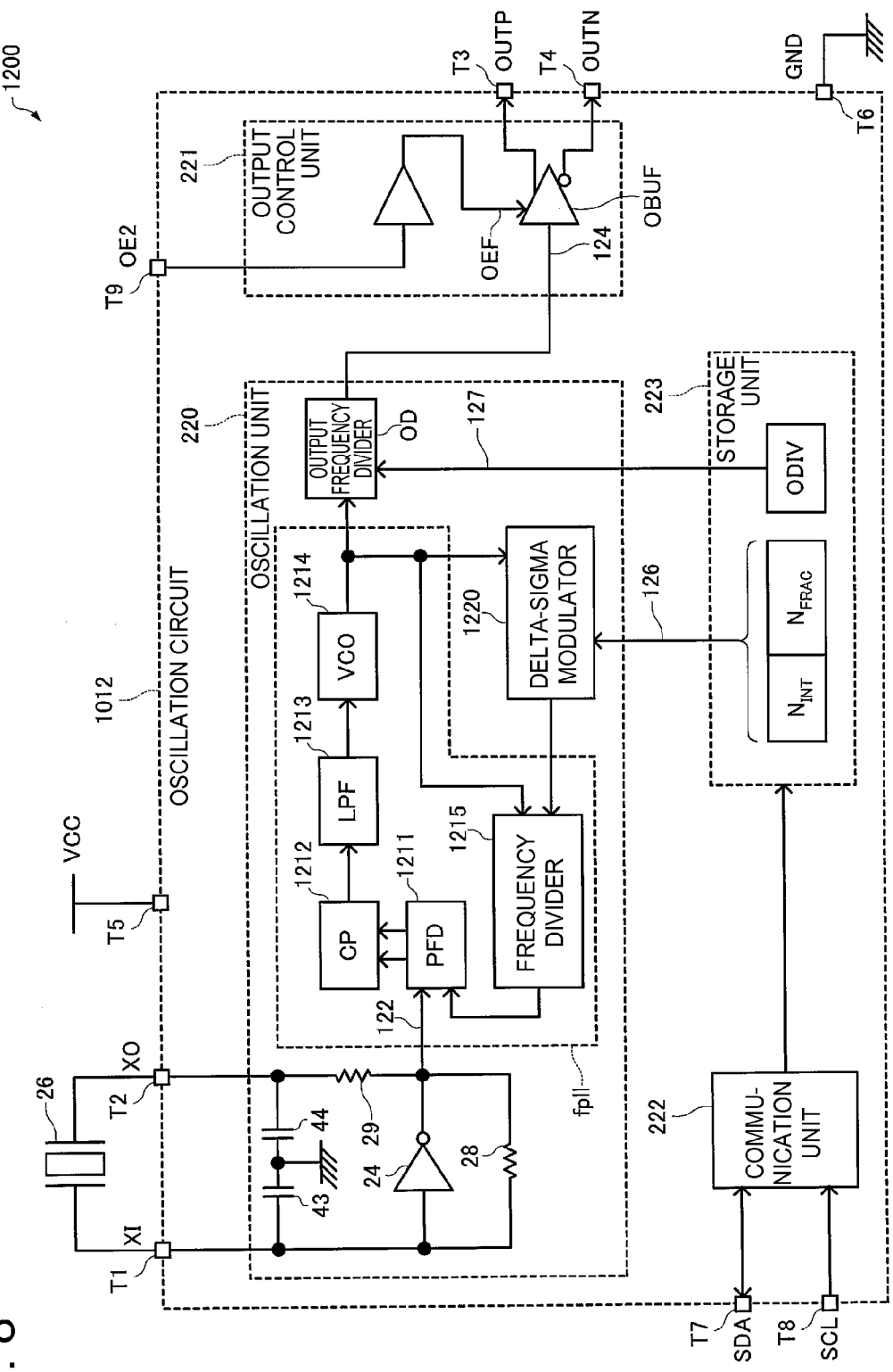
FIG. 8 is a block diagram of an oscillator including an oscillation circuit which is an example of the related art.

Here, an oscillation circuit 1012 which is an example of the related art will be described for comparison. FIG. 8 is a block diagram of an oscillator 1200 including the oscillation circuit 1012 which is an example of the related art. Meanwhile, the same components as those in FIG. 1 are denoted by the same reference numerals and signs, and thus the description thereof will not be given here.

As shown in FIG. 8, in the oscillation circuit 1012 which is an example of the related art, the second output control signal OE2 which is input from the terminal T9 changes to the output enabling signal OEF as it is through a buffer. When the second output control signal OE2 changes, for example, from "0" to "1" outside the oscillation circuit 1012, the non-inverted output signal OUTP and the inverted output signal OUTN are immediately output. In other words, output control with fewer delays can be performed.

However, in the oscillation circuit 1012 which is an example of the related art, the output enabling signal OEF (that is, the second output control signal OE2) is set to be independent from the parameters such as $N_{INT}$, $N_{FRAC}$, and ODIV. For this reason, for example, when $N_{FRAC}$ is updated and the non-inverted output signal OUTP and the inverted output signal OUTN having a frequency based on the updated $N_{FRAC}$ are desired to be output, a timing at which the second output control signal OE2 changes from "0" to "1" is required to be adjusted (delayed) in accordance with the updating of $N_{FRAC}$. This is because there is a possibility that the non-inverted output signal OUTP and the inverted output signal OUTN having a frequency based on $N_{FRAC}$ before the updating may be output when, for example, the updating of $N_{FRAC}$ and the change in the second output control signal OE2 from "0" to "1" are simultaneously performed. However, it is expected that terminals having the second output control signal OE2 and the characteristic control data being input thereto are also different from each other and that the control programs thereof are independent of each other. For this reason, it is generally difficult to adjust the timing in association with the update. In addition, when the parameters such as $N_{INT}$, $N_{FRAC}$, and ODIV are not updated, it may not be necessary to delay the timing at which the second output control signal OE2 changes. For this reason, the control of the second output control signal OE2 which is an example of the related art is always required to be classified by ascertaining updating conditions of the characteristic control data, which results in a problem in that the control thereof becomes complex.

Here, referring back to FIG. 1, the oscillation circuit 12 according to this embodiment can control the output buffer OBUF using the first output control signal OE1. The control data of the first output control signal OE1 is a signal which is input from the terminal T7 as serial data SDA, similar to the characteristic control data, and which is stored in the register of the storage unit 223. For this reason, in the oscillation circuit 12 according to this embodiment, it is possible to change the value of the control data of the first output control signal OE1 by using the same program as that of the characteristic control data, which makes it possible to easily associate the change in the characteristics of the oscillation signal 124 using the characteristic control data with a before-and-after relationship between the timings of the outputs of the non-inverted output signal OUTP and the inverted output signal OUTN based on the control data of the first output control signal OE1, and thus the problem of the oscillation circuit 1012 which is an example of the related art is solved. In addition, when the characteristics of the oscillation signal 124 using the characteristic control data are changed, the operation of the oscillation unit 220 becomes unstable. Thus, for example, there is a possibility of the amplitude of the oscillation signal 124 becoming excessive or a frequency drastically deviating due to the abnormal oscillation of the non-inverted output signal OUTP and the inverted output signal OUTN. In this embodiment, when the control data of the first output control signal OE1 is "0" at the time of changing the characteristics of the oscillation signal 124 using the characteristic control data, the outputs of the non-inverted output signal OUTP and the inverted output signal OUTN are stopped by setting the output enable signal OEF to "0" and stopping the operation of the output buffer OBUF, and then the characteristics of the oscillation signal 124 can be changed using the characteristic control data. Thus, it is possible to prevent a signal having an excessive amplitude or a signal having a deviated frequency from being output to, for example, an external device connected to the oscillator 200, and it is possible to reduce the occurrence of malfunction of an electronic device having the oscillator 200 mounted thereon or to increase the reliability of the electronic device.

Meanwhile, the oscillation circuit 12 according to this embodiment can also output the non-inverted output signal OUTP and the inverted output signal OUTN on the basis of the second output control signal OE2. For this reason, the oscillation circuit 12 according to this embodiment can immediately output the non-inverted output signal OUTP and the inverted output signal OUTN by using the second output control signal OE2 while being unaccompanied by the update of the parameters such as $N_{INT}$, $N_{FRAC}$, and ODIV.

Figures 2A, 2B:
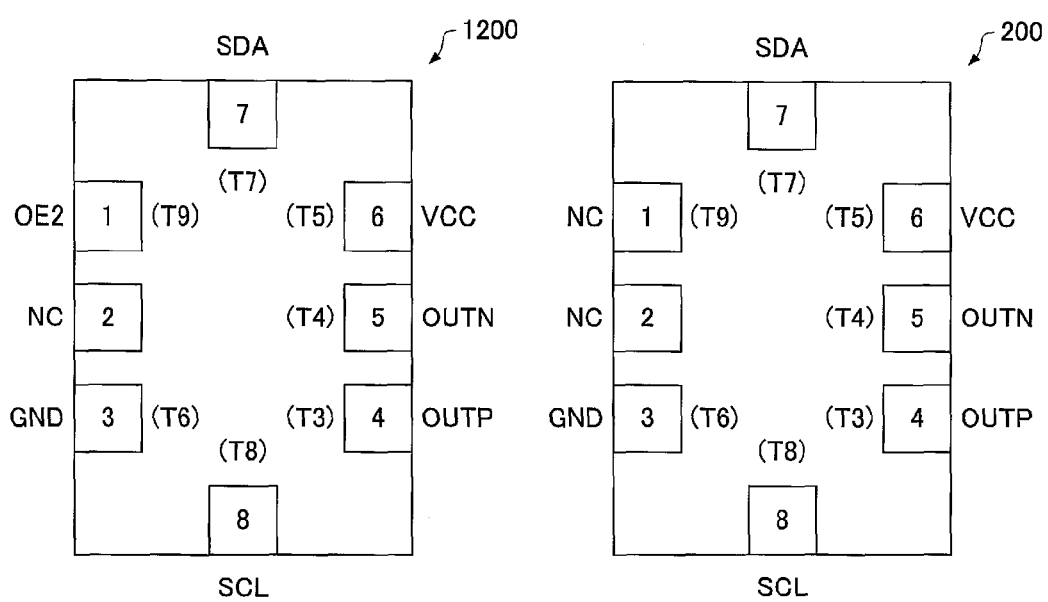
FIG. 2A is a diagram showing an exterior of an oscillator including an oscillation circuit which is an example of the related art.
FIG. 2B is a diagram showing an exterior of the oscillator including the oscillation circuit according to the first embodiment.

FIG. 2A is a diagram showing an exterior of the oscillator 1200 including the oscillation circuit 1012 which is an example of the related art. The oscillator 1200 includes terminals with number 1 to number 8. The terminal T9 of the oscillation circuit 1012 is allocated to the terminal with number 1, and the second output control signal OE2 is input thereto. The terminal with number 2 is a non-connection (NC) pin. The terminals T6 and T5 of the oscillation circuit 1012 are allocated to the terminals with number 3 and number 6, respectively, and a ground voltage GND and a power supply voltage VCC are supplied thereto, respectively. The terminals T3 and T4 of the oscillation circuit 1012 are allocated to the terminals with number 4 and number 5, respectively, and the non-inverted output signal OUTP and the inverted output signal OUTN are output thereto, respectively. The terminals T7 and T8 of the oscillation circuit 1012 are allocated to the terminals with number 7 and number 8, respectively, and the terminals are used as serial data SDA and serial clock SCL of an I2C bus, respectively. In the oscillator 1200, the second output control signal OE2 used as the output enabling signal OEF within the oscillator 1200 is required to be input from the terminal number 1. Meanwhile, the terminals T1 and T2 of the oscillation circuit 1012 are connected to the quartz crystal resonator 26 and are closed within the oscillator 1200.

FIG. 2B is a diagram showing an exterior of the oscillator 200 including the oscillation circuit 12 according to this embodiment. Meanwhile, the same components as those in FIG. 2A are denoted by the same reference numerals and signs, and thus the description thereof will not be given here. In the oscillation circuit 12 according to this embodiment, it is possible to control the outputs of the non-inverted output signal OUTP and the inverted output signal OUTN by inputting the control data of the first output control signal OE1 from the terminal T7 which is the same as that of the characteristic control data, unlike the oscillation circuit 1012 which is an example of the related art.

For this reason, the second output control signal OE2 may be used or may not be used as necessary. Consequently, it is possible to use the terminal with number 1 (to which the terminal T9 of the oscillation circuit 12 is allocated) as an NC pin as shown in FIG. 2B by pulling-up (or pulling-down) the second output control signal OE2 with number within the oscillation circuit 12. At this time, since it is not necessary to wire the terminal with number 1 on a substrate on which the oscillator 200 is mounted, it is possible to implement the user-friendly oscillator 200 as compared with the oscillator 1200 including the oscillation circuit 1012 which is an example of the related art.

As described above, the oscillation circuit 12 according to this embodiment and the oscillator 200 including the oscillation circuit 12 include a serial interface, can control the outputs of the non-inverted output signal OUTP and the inverted output signal OUTN on the basis of the control data of the first output control signal OE1 which is serial data to be input to the serial interface, and control the output enabling signal OEF without performing exclusive switching control using a switch. At this time, it is possible to easily associate the change in the characteristics of the oscillation signal 124 using the characteristic control data, which is serial data to be input to the serial interface, with a before-and-after relationship between the timings of the outputs of the non-inverted output signal OUTP and the inverted output signal OUTN based on the control data of the first output control signal OE1. In addition, it is also possible to set an existing terminal having the second output control signal OE2 being allocated thereto to an NC pin.

1.2. Second Embodiment

Figure 3:
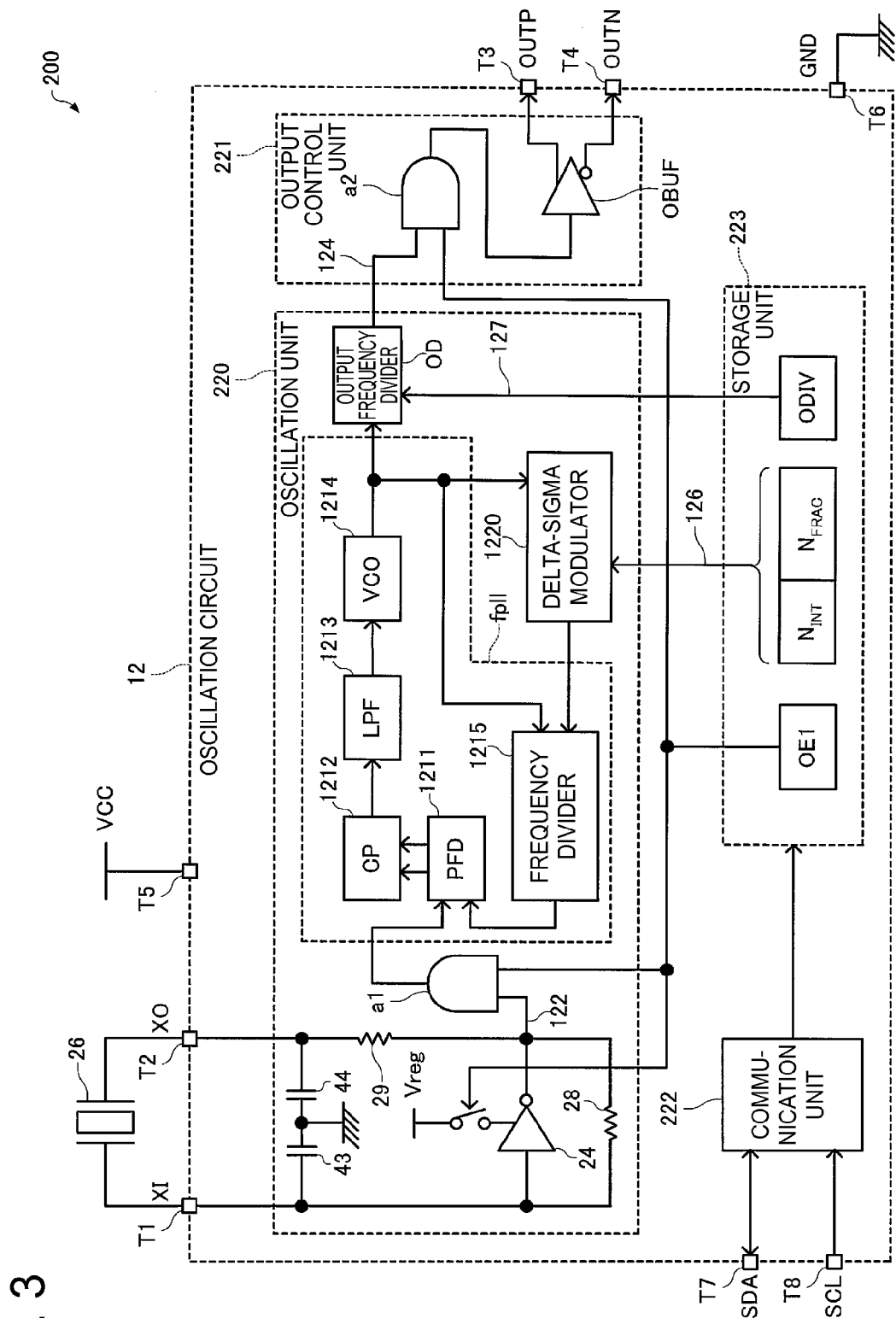
FIG. 3 is a block diagram of an oscillator including an oscillation circuit according to a second embodiment.

FIG. 3 is a block diagram of an oscillator 200 including an oscillation circuit 12 according to a second embodiment. The same components as those in FIG. 1 are denoted by the same reference numerals and signs, and thus the description thereof will not be given here. The oscillation circuit 12 according to this embodiment controls the operation of a main circuit unit that generates a reference oscillation signal 122 by oscillating a quartz crystal resonator 26 using a first output control signal OE1, unlike the oscillation circuit 12 according to the first embodiment. Although an output enabling signal OEF (see FIG. 1) is not illustrated in FIG. 3, an output buffer OBUF of the oscillation circuit 12 according to this embodiment is in an enabled state. Meanwhile, with regard to an output buffer OBUF, an enabled state refers to a state where a non-inverted output signal OUTP and an inverted output signal OUTN are output, and a disabled state refers to a state where the non-inverted output signal OUTP and the inverted output signal OUTN are not output.

When the value of a register of a storage unit 223 that stores control data of the first output control signal OE1 is "0", the oscillation circuit 12 according to this embodiment stops supplying a regulator voltage Vreg to an inverter 24 functioning as an amplifier. At this time, the main circuit unit does not oscillate the quartz crystal resonator 26 and does not generate the reference oscillation signal 122. For this reason, the oscillation circuit 12 does not output the non-inverted output signal OUTP and the inverted output signal OUTN.

Here, even when the control data of the first output control signal OE1 is "0", the oscillation circuit 12 according to the first embodiment does not stop the main circuit unit. For this reason, when the control data of the first output control signal OE1 changes to "1", the oscillation circuit can immediately output the non-inverted output signal OUTP and the inverted output signal OUTN, while the main circuit unit continuously consumes power. When the control data of the first output control signal OE1 is "0", the oscillation circuit 12 according to this embodiment stops the main circuit unit and thus can reduce power consumption. The oscillation circuit 12 according to this embodiment includes an AND circuit a1 with two inputs to which the reference oscillation signal 122 and the first output control signal OE1 stored in a register are input. A PFD 1211 receives an output of the AND circuit a1 as a reference signal. The oscillation circuit includes the AND circuit a1, and thus even when the value of a register of the storage unit 223 storing the control data of the first output control signal OE1 is "0", it is possible to prevent an input of the PFD 1211 from becoming unstable. In addition, the oscillation circuit 12 according to this embodiment includes an AND circuit a2 with two inputs to which an oscillation signal 124 and the first output control signal OE1 stored in the register are input. Then, the output buffer OBUF converts an output of the AND circuit a2 into a differential output. The oscillation circuit includes the AND circuit a2, and thus even when the value of the register of the storage unit 223 storing the control data of the first output control signal OE1 is "0", the values of the non-inverted output signal OUTP and the inverted output signal OUTN are uniquely determined, thereby obtaining a user-friendly oscillation circuit 12. Meanwhile, as another embodiment, the first output control signal OE1 may also be used as an output enabling signal OEF. In other words, when the value of the control data of the first output control signal OE1 is "0", the main circuit unit may be stopped, and the output buffer OBUF may be set to be in a disabled state.

In addition, the oscillation circuit 12 according to this embodiment controls the outputs of the non-inverted output signal OUTP and the inverted output signal OUTN by using only the first output control signal OE1. In other words, unlike the oscillation circuit 12 according to the first embodiment, a second output control signal OE2 is not used. For this reason, it is possible to omit a terminal (terminal T9 of FIG. 1) which is necessary for the second output control signal OE2 and to implement the oscillation circuit 12 which is small in size by reducing the number of terminals. In addition, it is also possible to use the terminal allocated to the second output control signal OE2 for another purpose.

Figures 4A, 4B:
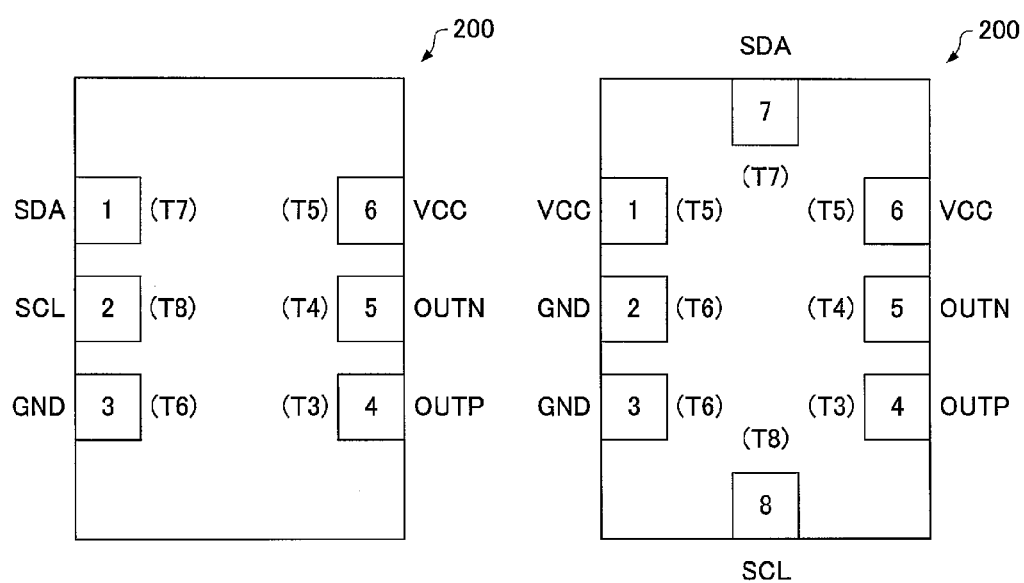
FIG. 4A is a diagram showing an exterior of the oscillator including the oscillation circuit according to the second embodiment.
FIG. 4B is a diagram showing another outline of the oscillator including the oscillation circuit according to the second embodiment.

FIGS. 4A and 4B are diagrams illustrating an exterior of the oscillator 200 including the oscillation circuit 12 according to this embodiment. Meanwhile, the same components as those in FIGS. 1 to 3 are denoted by the same reference numerals and signs, and thus the description thereof will not be given here. FIG. 4A is a diagram showing an exterior of the oscillator 200 using a 6-pin package that includes terminals with number 1 to number 6. Although an 8-pin package is used in the oscillator 200 (see FIG. 2B) which includes the oscillation circuit 12 according to the first embodiment, a terminal allocated to the second output control signal OE2 can be omitted in this embodiment, and thus it is possible to use a 6-pin package by omitting the NC pin of FIG. 2B. For this reason, it is possible to reduce the size of the oscillator 200 and to obtain the effects of improved reliability and reduced cost by reducing the number of wire bondings.

In addition, FIG. 4B is a diagram showing an exterior of the oscillator 200 using an 8-pin package that includes terminals with number 1 to number 8. In this example, a power supply is enhanced rather than reducing the number of pins of a package. In other words, the number of terminals for supplying a power supply voltage VCC and a ground voltage GND is four, that is, terminals with number 1 to number 3 and a terminal with number 6, rather than two. For example, it is possible to enhance a power supply by supplying the power supply voltage VCC to the terminal with number 1 and the terminal with number 6. Here, it is also possible to selectively use the terminals in accordance with the layout of a substrate on which the oscillator 200 is mounted. For example, a method can be used of selecting the terminal with number 1 and supplying the power supply voltage VCC (to only the terminal with number 1) so that a long wiring is not necessary in a certain substrate, and selecting the terminal with number 6 and supplying the power supply voltage VCC (to only the terminal with number 6) in another substrate. In other words, the oscillator 200 of FIG. 4B can select and use a terminal for a power supply, and thus is user-friendly.

As described above, the oscillation circuit 12 according to this embodiment and the oscillator 200 including the oscillation circuit 12 include a serial interface, can control the outputs of the non-inverted output signal OUTP and the inverted output signal OUTN on the basis of the control data of the first output control signal OE1 which is serial data to be input to the serial interface, and control the output enabling signal OEF without performing exclusive switching control using a switch. At this time, it is possible to easily associate the change in the characteristics of the oscillation signal 124 using the characteristic control data, which is serial data to be input to the serial interface, with a before-and-after relationship between the timings of the outputs of the non-inverted output signal OUTP and the inverted output signal OUTN based on the control data of the first output control signal OE1. In addition, since the second output control signal OE2 is not used, it is possible to achieve a reduction in size by omitting the terminal thereof and to improve performance and usability by allocating the terminal thereof for another use.

1.3. Third Embodiment

Figure 5:
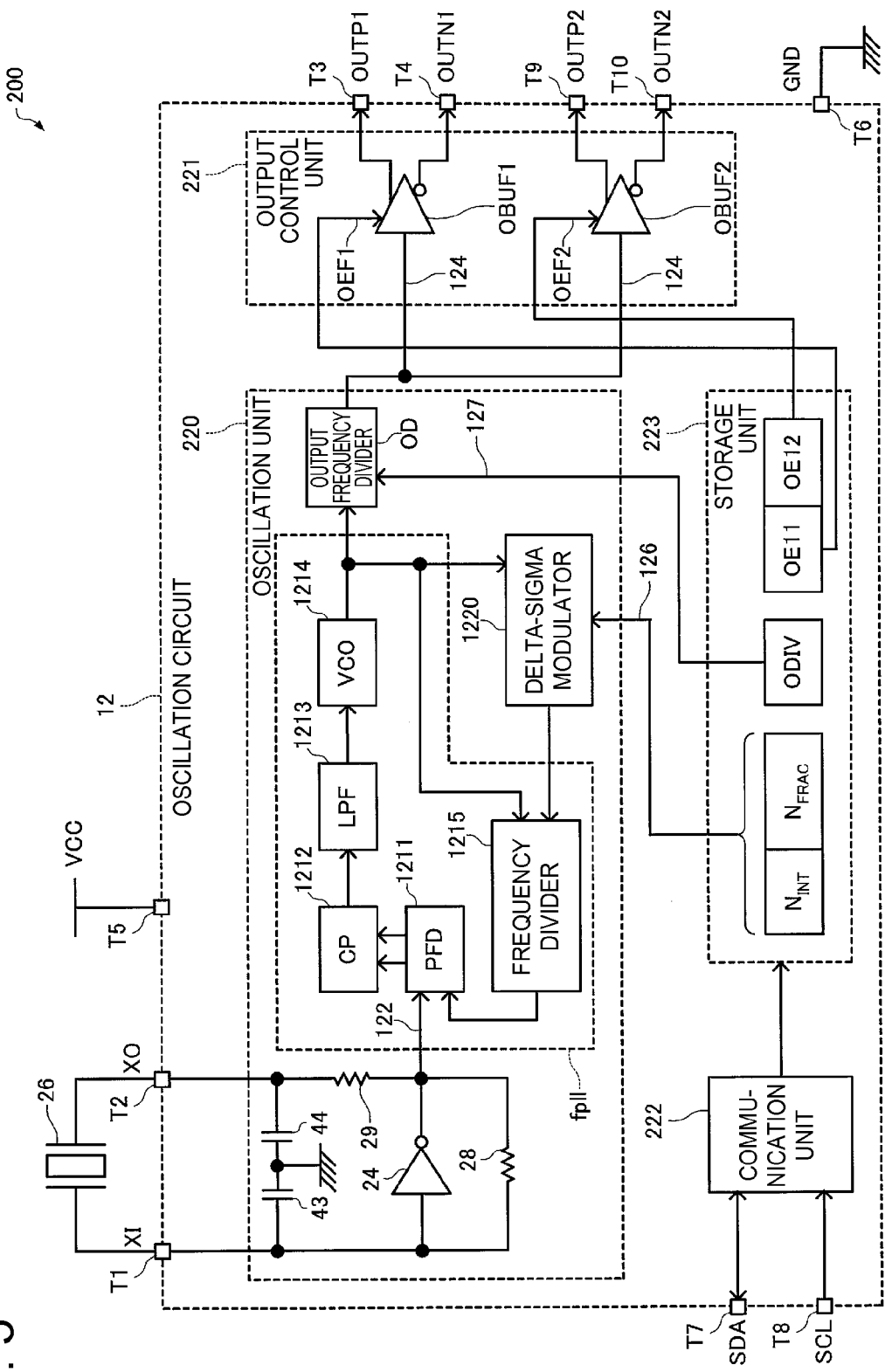
FIG. 5 is a block diagram of an oscillator including an oscillation circuit according to a third embodiment.

FIG. 5 is a block diagram of an oscillator 200 including an oscillation circuit 12 according to a third embodiment. The same components as those in FIGS. 1 and 3 are denoted by the same reference numerals and signs, and thus the description thereof will not be given here. Unlike the oscillation circuit 12 according to the first embodiment, the oscillation circuit 12 according to the third embodiment includes a plurality of output buffers OBUF1 and OBUF2 which are capable of being independently controlled. At this time, as in an oscillation circuit 1012 (see FIG. 8) which is an example of the related art, when there is an attempt to independently control the plurality of output buffers OBUF1 and OBUF2 using a second output control signal OE2, and a plurality of terminals are required. However, the oscillation circuit 12 according to this embodiment can independently control the plurality of output buffers OBUF1 and OBUF2 without increasing the number of terminals by using control data of a first output control signal OE1.

As shown in FIG. 5, an output control unit 221 includes the output buffer OBUF1 and the output buffer OBUF2. The output buffer OBUF1 outputs a non-inverted output signal OUTP1 and an inverted output signal OUTN1 when an output enabling signal OEF1 is "1", and does not output the non-inverted output signal OUTP1 and the inverted output signal OUTN1 when the output enabling signal OEF1 is "0". In addition, the output buffer OBUF2 outputs a non-inverted output signal OUTP2 and an inverted output signal OUTN2 when an output enabling signal OEF2 is "1", and does not output the non-inverted output signal OUTP2 and the inverted output signal OUTN2 when the output enabling signal OEF2 is "0".

Meanwhile, in this embodiment, the number of output buffers is two, but is not limited thereto. For example, the number of output buffers may be three or more. In this embodiment, signals input to the plurality of output buffers are the same. Specifically, an oscillation signal 124 is input from an oscillation unit 220, but different signals may be input therefrom. For example, as an oscillation circuit 12 according to another embodiment, a configuration may be used in which the oscillation circuit includes the oscillation unit 220 generating a signal to be input to the output buffer OBUF1 and another oscillation unit 220 generating a signal to be input to the output buffer OBUF2.

A storage unit 223 includes registers of a plurality of bits corresponding to a plurality of output enabling signals. In this embodiment, a value stored in a register OE11 serves as the output enabling signal OEF1, and a value stored in a register OE12 serves as an output enabling signal OEF2. At this time, each of the register OE11 and the register OE12 is one bit, and the first output control signal OE1 is a signal including values of two bits (corresponding to values of a plurality of bits according to the invention). Since the control data of the first output control signal OE1 is input from a terminal T7 as serial data SDA, the number of terminals of the oscillation circuit 12 is not increased in spite of including values of a plurality of bits. In other words, the oscillation circuit 12 according to this embodiment can independently control the plurality of output buffers OBUF1 and OBUF2 without increasing the number of terminals by using the control data of the first output control signal OE1. For example, it is assumed that the control data of the first output control signal OE1 includes values of two bits "01" and that "0" and "1" are stored in the register OE11 and the register OE12, respectively. At this time, the output buffer OBUF1 is in a disabled state, but the output buffer OBUF2 is in an enabled state.

FIG. 6 is a diagram illustrating an exterior of the oscillator 200 including the oscillation circuit 12 according to this embodiment. Meanwhile, the same components as those in FIGS. 1 to 5 are denoted by the same reference numerals and signs, and thus the description thereof will not be given here. FIG. 6 is a diagram showing an exterior of the oscillator 200 using an 8-pin package that includes terminals with number 1 to number 8. Compared with the oscillator 200 (see FIG. 2B) which includes the oscillation circuit 12 according to the first embodiment, the terminal allocated to the second output control signal OE2 can be omitted in this embodiment, and thus it is possible to allocate two terminals together with an NC pin (see FIG. 2B) for another use. Consequently, it is possible to implement the oscillator 200 that performs two pairs of differential outputs in the 8-pin package by allocating the terminal with number 1 and the terminal with number 2 to differential output signals (the inverted output signal OUTN2 and the non-inverted output signal OUTP2) from the second output buffer OBUF2.

As described above, the oscillation circuit 12 according to this embodiment and the oscillator 200 including the oscillation circuit 12 include a serial interface, can control the outputs of the non-inverted output signal OUTP and the inverted output signal OUTN, and control the output enabling signal OEF without performing exclusive switching control using a switch. At this time, it is possible to easily associate the change in the characteristics of the oscillation signal 124 using the characteristic control data with a before-and-after relationship between the timings of the outputs of the non-inverted output signal OUTP and the inverted output signal OUTN based on the control data of the first output control signal OE1. In addition, since the second output control signal OE2 is not used, it is possible to independently control the plurality of output buffers OBUF1 and OBUF2 without increasing the number of terminals. In addition, it is possible to implement the oscillator 200 including a plurality of outputs in a package having a small number of terminals by using the terminal allocated to the second output control signal OE2 in the example of the related art as an output terminal.

1.4. Modification Example

In the oscillation circuits 12 according to the first to third embodiments and the oscillator 200 including the oscillation circuit 12, a two-wire serial interface (specifically, an I2C) is used. However, a one-wire serial interface may be used, and thus one more terminal is further reduced, which allows a reduction in size. For example, a 1-WIRE (registered trademark) can be used as the one-wire serial interface.

FIGS. 7A and 7B are diagrams showing an example of an exterior of the oscillator 200 when a one-wire serial interface is used. Meanwhile, the same components as those in FIGS. 1 to 6 are denoted by the same reference numerals and signs, and thus the description thereof will not be given here. FIG. 7A is a diagram showing an exterior of the oscillator 200 using a 6-pin package that includes terminals with number 1 to number 6. For example, compared with the oscillator 200 of FIG. 4A, serial communication can be performed using only the terminal with number 2 (1WS of FIG. 7A), and thus it is possible to allocate another function to the terminal with number 1. For example, when the oscillator 200 of FIG. 7A can perform frequency-adjustment of the oscillation signal 124 using a control voltage VC, it is possible to allocate the control voltage VC to the terminal with number 1. Accordingly, compared with the oscillator 200 of FIG. 4A, it is possible to further add functionality in this modification example.

In addition, FIG. 7B is a diagram showing an exterior of the oscillator 200 using a 4-pin package that includes terminals with number 1 to number 4. When the oscillator 200 uses a single-ended output OUT rather than using a differential output, it is possible to implement the small-sized oscillator 200 that is also capable of serial communication using only four terminals.

2. Electronic Device

An electronic device 300 according to this embodiment will be described below with reference to FIGS. 9 to 10. Meanwhile, the same components as those in FIGS. 1 to 8 are denoted by the same reference numerals and signs, and thus the description thereof will not be given here.

Figure 9:
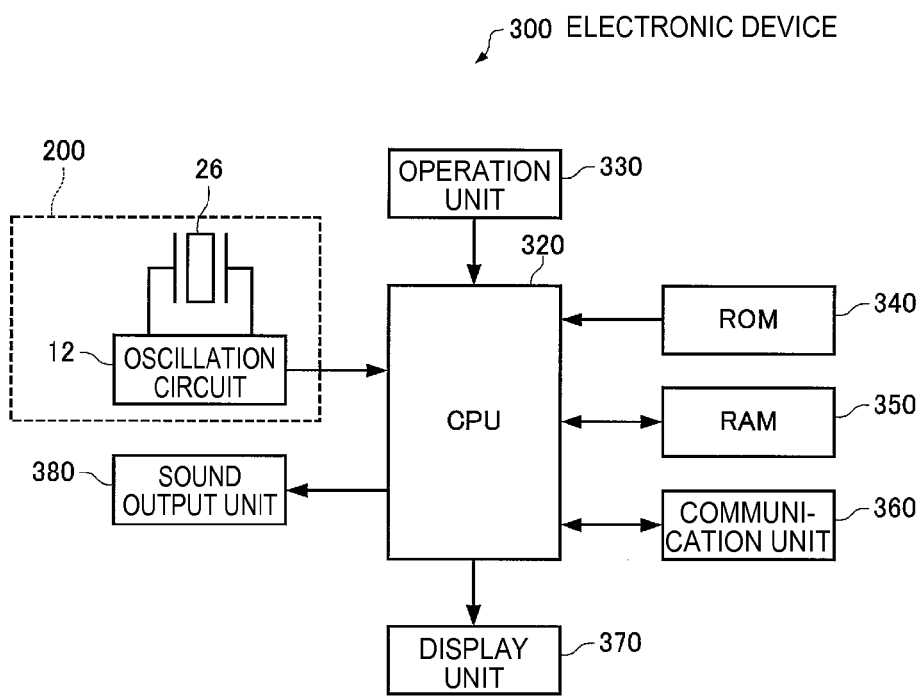
FIG. 9 is a functional block diagram of an electronic device.

FIG. 9 is a functional block diagram of the electronic device 300. The electronic device 300 is configured to include an oscillator 200 including an oscillation circuit 12 and a quartz crystal resonator 26, a central processing unit (CPU) 320, an operation unit 330, a read only memory (ROM) 340, a random access memory (RAM) 350, a communication unit 360, a display unit 370, and a sound output unit 380. Meanwhile, the electronic device 300 may have a configuration in which some of the components (respective units) of FIG. 9 are omitted or changed, or may have a configuration in which other components are added thereto.

The oscillator 200 supplies a clock pulse not only to the CPU 320 but also to the respective units (not shown). Meanwhile, the oscillator 200 may be configured such that the oscillation circuit 12 and the quartz crystal resonator 26 are integrally packaged.

The CPU 320 performs various types of calculation processes and control processes using the clock pulse which is output by the oscillation circuit 12, in accordance with a program stored in the ROM 340 or the like. Specifically, the CPU 320 performs various types of processes in response to an operation signal from the operation unit 330, a process of controlling the communication unit 360 in order to perform data communication with the outside, a process of transmitting a display signal for causing the display unit 370 to display various pieces of information, a process of causing the sound output unit 380 to output various types of sounds, and the like.

The operation unit 330 is an input device constituted by operation keys, button switches or the like, and outputs an operation signal in response to a user's operation to the CPU 320.

The ROM 340 stores programs, data, or the like for causing the CPU 320 to perform various types of calculation and control processes.

The RAM 350 is used as a work area of the CPU 320, and temporarily stores programs and data which are read out from the ROM 340, data which is input from the operation unit 330, computation results executed by the CPU 320 in accordance with various types of programs, and the like.

The communication unit 360 performs a variety of controls for establishing data communication between the CPU 320 and an external device.

The display unit 370 is a display device constituted by a liquid crystal display (LCD) or the like, and displays various pieces of information on the basis of a display signal which is input from the CPU 320.

The sound output unit 380 is a device that outputs the sound of a speaker or the like.

As described above, the oscillation circuit 12 included in the oscillator 200 can generate an oscillation signal 124 as a clock pulse and can implement the control of output enabling on the basis of control data of a first output control signal OE1 without performing exclusive switching control using a switch. In addition, it is possible to easily associate the change in the characteristics of the oscillation signal 124 using characteristic control data with a before-and-after relationship between the timings of the outputs of the oscillation signal 124 based on the control data of the first output control signal OE1 and to simplify a control program (executed by, for example, the CPU 320).

As the electronic device 300, various electronic devices are considered for use. For example, the electronic device includes a personal computer (for example, mobile-type personal computer, laptop personal computer, or tablet personal computer), a mobile terminal such as a cellular phone, a digital still camera, an ink jet ejecting apparatus (for example, ink jet printer), a storage area network device such as a router or a switch, a local area network device, a device for a mobile terminal base station, a television, a video camera, a video recorder, a car navigation device, a pager, an electronic notebook (also including a communication function), an electronic dictionary, an electronic calculator, an electronic game console, a game controller, a word processor, a workstation, a TV phone, a security TV monitor, electronic binoculars, a POS terminal, a medical instrument (for example, electronic thermometer, sphygmomanometer, blood glucose monitoring system, electrocardiogram measurement device, ultrasound diagnostic device, and electronic endoscope), a fish finder, various types of measuring apparatus, meters and gauges (for example, meters and gauges of a vehicle, an aircraft, and a vessel), a flight simulator, a head mounted display, a motion tracer, a motion tracker, a motion controller, PDR (walker position and direction measurement), and the like.

Figure 10:
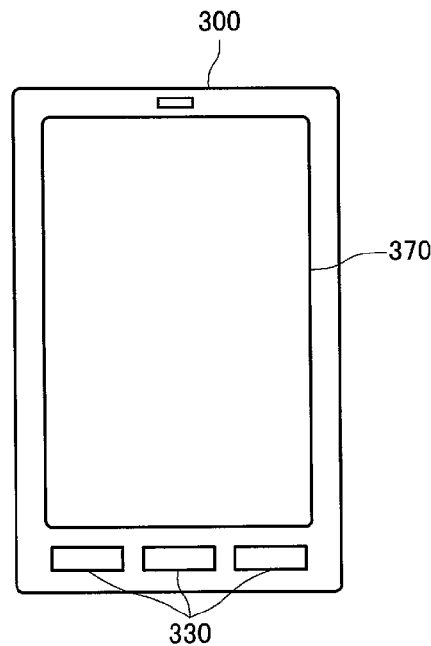
FIG. 10 is a diagram showing an example of an exterior of an electronic device.

FIG. 10 is a diagram showing an example of an exterior of a smart phone which is an example of the electronic device 300. The smart phone which is the electronic device 300 includes buttons as the operation units 330 and includes an LCD as the display unit 370. The smart phone which is the electronic device 300 includes the oscillation circuit 12, and thus it is possible to implement the control of output enabling on the basis of the control data of the first output control signal OE1 without performing exclusive switching control using a switch. In addition, it is possible to easily associate the change in the characteristics of the oscillation signal 124 using characteristic control data with a before-and-after relationship between the timings of the outputs of the oscillation signal 124 based on the control data of the first output control signal OE1 and to simplify a control program.

3. Moving Object

Figure 11:
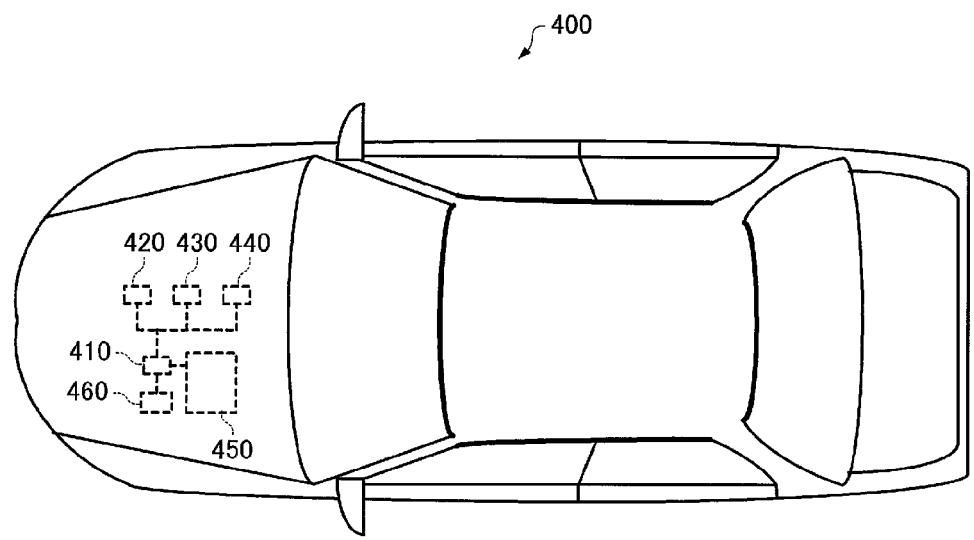
FIG. 11 is a diagram showing an example of a moving object.

A moving object 400 according to this embodiment will be described with reference to FIG. 11. FIG. 11 is a diagram (top view) showing an example of the moving object 400 according to this embodiment. The moving object 400 shown in FIG. 11 is configured to include an oscillation circuit 410, controllers 420, 430, and 440 that perform a variety of controls of an engine system, a brake system, a keyless entry system and the like, a battery 450, and a backup battery 460. Meanwhile, the moving object 400 according to this embodiment may have a configuration in which some of the components (respective units) of FIG. 11 are omitted or changed, and may have a configuration in which other components are added.

The oscillation circuit 410 corresponds to the above-mentioned oscillation circuit 12 and is used in connection with the quartz crystal resonator 26 which is not shown in the drawing, and may be replaced with the oscillator 200. The detailed description of other components will not be given, but high reliability is required in order to perform control required for the movement of the moving object 400. For example, it is possible to enhance reliability by including the backup battery 460 in addition to the battery 450.

A clock pulse which is output by the oscillation circuit 410 is required to reliably stop an output when unstable. The oscillation circuit 410 includes the oscillation circuit 12, and thus it is possible to implement the control of output enabling on the basis of the control data of the first output control signal OE1 without performing exclusive switching control using a switch. In addition, it is possible to easily associate the change in the characteristics of the oscillation signal 124 using characteristic control data with a before-and-after relationship between the timings of the outputs of the oscillation signal 124 based on the control data of the first output control signal OE1.

Various moving objects are considered as such a moving object 400. The moving object includes, for example, an automobile (also including an electric automobile), an aircraft such as a jet engine airplane or a helicopter, a vessel, a rocket, a satellite, and the like.

4. Others

The invention includes configurations (for example, configurations having the same functions, methods and results, or configurations having the same objects and effects) which are substantially the same as the configurations described in the above embodiments. In addition, the invention includes configurations in which non-essential elements of the configurations described in the embodiments are replaced.

Figure 12:
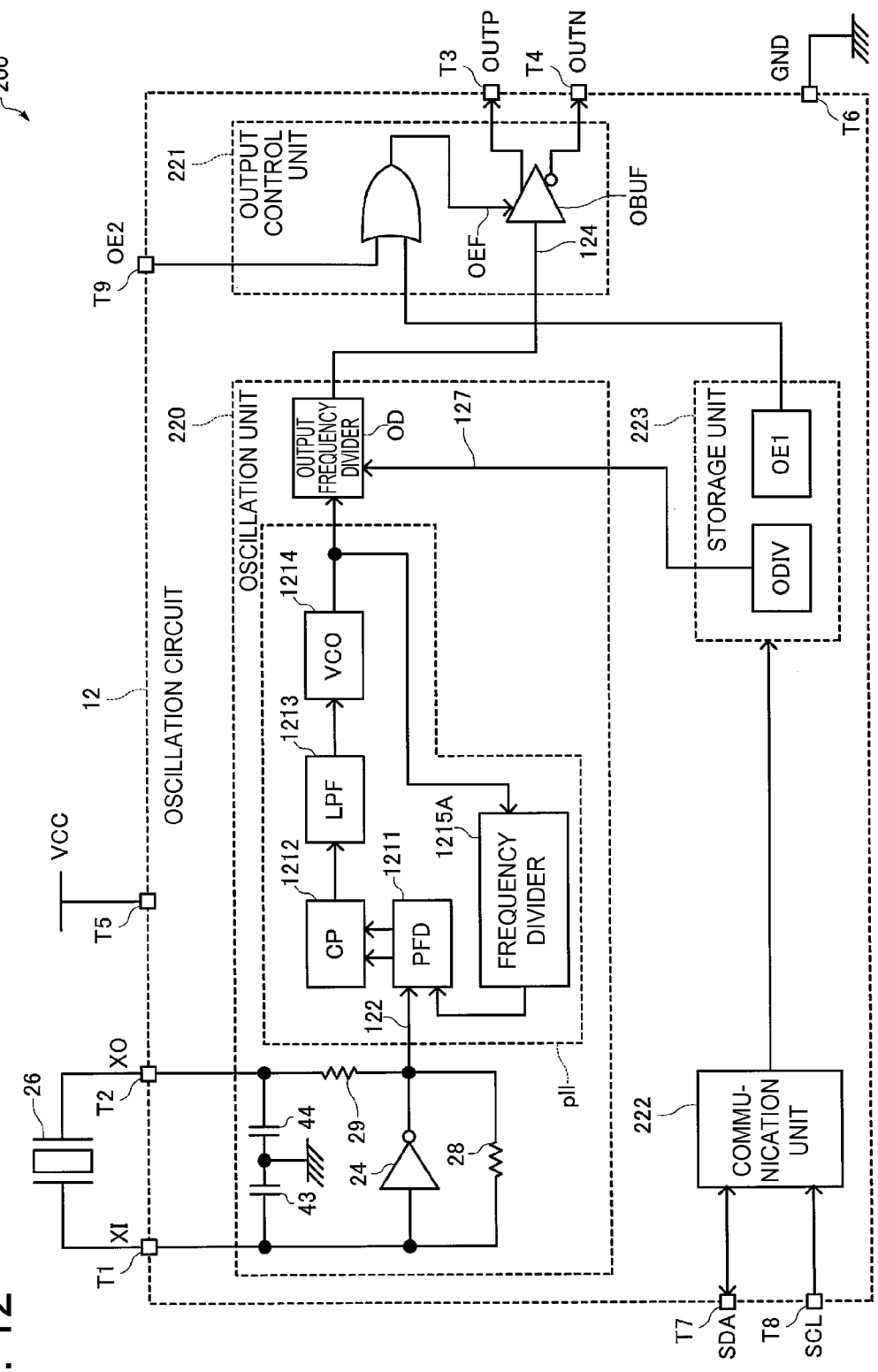
FIG. 12 is a diagram showing a configuration example of an oscillation circuit using an integer frequency-dividing PLL.

For example, FIG. 12 is a diagram showing a configuration in which the fractional N-PLL (fpll of FIG. 1) is replaced with the integer frequency-dividing PLL (pll of FIG. 12) in the oscillation circuit 12 according to the first embodiment. The integer frequency-dividing PLL includes a frequency divider 1215A that frequency-divides an integer, and the delta-sigma modulator 1220 is not necessary. Accordingly, unlike the first embodiment, the storage unit 223 does not include a register that stores $N_{INT}$ and $N_{FRAC}$. The oscillation circuit 12 having such a configuration also includes a serial interface, can control the outputs of the non-inverted output signal OUTP and the inverted output signal OUTN, and controls the output enabling signal OEF without performing exclusive switching control using a switch. In addition, it is possible to easily associate the change in the characteristics of the oscillation signal 124 using characteristic control data (ODIV in the example of FIG. 12) with a before-and-after relationship between the timings of the outputs of the non-inverted output signal OUTP and the inverted output signal OUTN based on the control data of the first output control signal OE1.

In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application No. 2013-215622, filed Oct. 16, 2013 is expressly incorporated by reference herein.

What is claimed is:

1. An oscillation circuit that generates an oscillation signal by oscillating an oscillation element, the oscillation circuit comprising:
    a first terminal to which characteristic control data for controlling characteristics of the oscillation signal including at least a frequency is input and to which control data of a first output control signal for controlling an output of the oscillation signal is input; and
    a second terminal to which a second output control signal for controlling the output of the oscillation signal is input.

2. The oscillation circuit according to claim 1, further comprising:

a storage unit that stores the characteristic control data and the control data of the first output control signal.

3. The oscillation circuit according to claim 2, wherein the characteristics of the oscillation signal and the output of the oscillation signal are controlled on the basis of the characteristic control data and the control data of the first output control signal which are stored in the storage unit.

4. The oscillation circuit according to claim 1, further comprising:
   an oscillation unit that generates the oscillation signal; and
   an output buffer to which the oscillation signal is input from the oscillation unit,
   wherein the control data of the first output control signal for instructing the output of the oscillation signal to stop is input to the first terminal, so that an output from the output buffer is stopped and an output of the oscillation signal is stopped.

5. The oscillation circuit according to claim 1, further comprising:
   an oscillation unit that generates the oscillation signal; and
   an output buffer to which the oscillation signal is input from the oscillation unit,
   wherein the control data of the first output control signal for instructing the output of the oscillation signal to stop is input to the first terminal, so that an operation of the oscillation unit is stopped and an output of the oscillation signal is stopped.

6. The oscillation circuit according to claim 1, further comprising:
   a plurality of output terminals that output the oscillation signals,
   wherein the control data of the first output control signal is data having values of a plurality of bits, and
   wherein the outputs of the oscillation signals from the plurality of output terminals are independently controlled using the respective values of the plurality of bits.

7. An oscillator comprising:
   the oscillation circuit according to claim 1; and
   the oscillation element.

8. An electronic device comprising the oscillation circuit according to claim 1.

9. A moving object comprising the oscillation circuit according to claim 1.

* * * * *